(12) United States Patent
Kamp et al.

(10) Patent No.: US 8,901,004 B2
(45) Date of Patent: *Dec. 2, 2014

(54) PLASMA ETCH METHOD TO REDUCE MICRO-LOADING

(75) Inventors: Tom Kamp, San Jose, CA (US); Qian Fu, Fremont, CA (US); I. C. Jang, Sungnam (KR); Linda Braly, Oakland, CA (US); Shenjian Liu, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 445 days.

This patent is subject to a terminal disclaimer.

(21) Appl. No.: 12/840,034

(22) Filed: Jul. 20, 2010

(65) Prior Publication Data

US 2011/0021029 A1    Jan. 27, 2011

Related U.S. Application Data

(60) Provisional application No. 61/228,779, filed on Jul. 27, 2009.

(51) Int. Cl.
| | |
|---|---|
| *H01L 21/311* | (2006.01) |
| *C03C 15/00* | (2006.01) |
| *C03C 25/68* | (2006.01) |
| *C23F 1/00* | (2006.01) |
| *H01L 21/768* | (2006.01) |
| *H01L 21/3065* | (2006.01) |

(52) U.S. Cl.
CPC ...... *H01L 21/76816* (2013.01); *H01L 21/3065* (2013.01)
USPC ........... 438/696; 438/700; 438/701; 438/702; 216/46; 216/49

(58) Field of Classification Search
USPC ....................... 216/46, 49; 438/696, 700–702
See application file for complete search history.

(56) References Cited

U.S. PATENT DOCUMENTS

| 7,368,394 | B2 | 5/2008 | Shen et al. | |
|---|---|---|---|---|
| 7,910,489 | B2 * | 3/2011 | Kim et al. ..................... | 438/717 |
| 2004/0033697 | A1 * | 2/2004 | Kumar et al. ................. | 438/710 |
| 2005/0048789 | A1 | 3/2005 | Merry et al. | |
| 2007/0193973 | A1 * | 8/2007 | Kim et al. ....................... | 216/41 |
| 2007/0243714 | A1 * | 10/2007 | Shin et al. .................... | 438/706 |
| 2008/0124935 | A1 | 5/2008 | Chang et al. | |
| 2010/0055917 | A1 * | 3/2010 | Kim .............................. | 438/706 |

FOREIGN PATENT DOCUMENTS

WO    WO-2009008958 A2    1/2009

* cited by examiner

*Primary Examiner* — Allan Olsen
*Assistant Examiner* — Margaret D Klunk
(74) *Attorney, Agent, or Firm* — Beyer Law Group LLP

(57) ABSTRACT

A method of producing plurality of etched features in an electronic device is disclosed that avoids micro-loading problems thus maintaining more uniform sidewall profiles and more uniform critical dimensions. The method comprises performing a first time-divisional plasma etch process step within a plasma chamber to a first depth of the plurality of etched features, and performing a flash process step to remove any polymers from exposed surfaces of the plurality of etched features without requiring an oxidation step. The flash process step is performed independently of the time-divisional plasma etch step. A second time-divisional plasma etch process step is performed within the plasma chamber to a second depth of the plurality of etched features. The method may be repeated until a desired etch depth is reached.

18 Claims, 4 Drawing Sheets

PLASMA ETCH METHOD TO REDUCE MICRO-LOADING

RELATED APPLICATION

The present application claims the benefit under 35 U.S.C. 119(e) of U.S. Provisional Patent Application Ser. No. 61/228,779, filed Jul. 27, 2009, which is incorporated herein by reference in its entirety.

TECHNICAL FIELD

The present invention relates generally to the field of process equipment used in the semiconductor, data storage, flat panel display, as well as allied or other industries. More particularly, the present invention relates to etching closely-spaced features on substrates in plasma-based process equipment.

BACKGROUND

Semiconductor device geometries (i.e., integrated circuit design rules) have decreased dramatically in size since integrated circuit (IC) devices were first introduced several decades ago. ICs have generally followed "Moore's Law," which means that the number of devices fabricated on a single integrated circuit chip doubles every two years. Today's IC fabrication facilities (i.e., "fabs") are routinely producing 65 nm (0.065 μm) feature size devices, and future fabs will soon be producing devices having even smaller feature sizes.

In most IC fabrication facilities, part of the fabrication process involves employing plasma in process equipment to either react or facilitate a reaction with a substrate such as a semiconductor wafer. Plasma processing is used for a wide variety of applications including etching of materials from substrates, deposition of materials onto substrates, cleaning of substrate surfaces, and modification of substrate surfaces.

As feature sizes have become smaller, the aspect ratio, or the ratio between the depth and the width of the feature has steadily increased. Fabrication facilities are currently etching materials into features having aspect ratios of from about 50:1 to 100:1 or greater. Traditionally, features having aspect ratios of about 10:1 were produced by anisotropic etching dielectric layers to a predetermined depth and width. However, when forming higher aspect ratio features, anisotropic etching using conventional sidewall passivation techniques has become increasingly difficult to control. Resulting features have non-uniform spacing or non-uniform profiles, thus losing designed critical dimensions (CDs) of the features.

Etching deeply-recessed features is a principal technology used to fabricate capacitive storage nodes, contact vias, and trench features into semiconductor structures. Strict control of etch profiles is needed to provide deeply etched features having required CDs.

Due to the ever-decreasing size of device structures, the thickness of a photoresist layer must be carefully controlled to meet critical feature dimensions. The thickness of the photoresist is often in the range of about 250 nm or less. A hard masking material is used under the photoresist to provide sufficient time for deep-etching of an underlying substrate without etching through the patterned mask.

A carbon-containing gas is frequently used as at least one of the etchant gases during plasma deep-etching into a substrate underlying the photoresist mask and the hard mask. The carbon-containing gas contributes polymer-forming materials onto various exposed surfaces fabricated on the substrate. The polymer-forming materials can frequently plug openings in features being etched and have deleterious effects on parameters such as top CD and CD bias uniformity. In the worst case, openings to smaller CD features which are to be etched may become completely plugged if a resulting polymeric residue is sufficiently thick. Once plugged, the etching stops. Using increased power to drive the etch plasma, for purposes of increasing etch rate, typically leads to an increase in the amount of hard, silicon-containing polymeric residues that are re-deposited on various surfaces. Thus, concerns about formation of the residues affects an ability to increase the etch rate during etching of a deeply recessed structure.

Yet another challenge associated with etching features with high aspect ratios is controlling the etch rate in features formed through multiple layers and having different feature densities. In such a case, each layer may etch at a different rate depending on feature density.

With reference to FIG. 1, a substrate 101 includes a dielectric film layer 103 with a plurality of high density features 109 and an isolated feature 111 formed from an underlying film 105 or bulk material (not shown). Each of the features 109, 111 is capped with a combination photoresist layer/hard mask 107. Faster etch rates occur proximate to the isolated feature 111 and often result in selectively over etching the dielectric film layer 103. In contrast, slower etch rates occurring proximate to the high density features 105 frequently have unetched portions 113.

As features move toward even higher aspect ratios and densities, maintaining efficient etching rates over the low and high feature density regions without either under-etching the upper layers or over-etching into the lower layers has become increasingly difficult to control. The failure to form the features or patterns on the substrate as designed may result in unwanted defects. Further, subsequent process steps are adversely affected, ultimately degrading or disabling the performance of the final integrated circuit structure.

Another problem in etching features with high aspect ratios is the occurrence of a micro-loading effect. Micro-loading is also known as "aspect ratio dependent etch" or "RIE lag" and is a measure of the variation in etch dimensions between regions of high and low feature densities. Low feature density regions (e.g., isolated regions) receive more reactive etchants per surface area compared with high feature density regions (i.e., dense regions) due to larger total openings of the surface areas, thereby resulting in a higher etching rate in the low density regions. Sidewall passivation layers generated from etch by-products exhibit similar pattern density dependence where thicker passivation layers are formed for the isolated features due to more by-products being generated in the region. The difference in reactants and the passivation per surface area between these two regions increases as feature density differences increase.

Referring now to FIG. 2A, differences in etch rates and formation of by-products between high and low feature density regions cause various differences in sidewall etch. An isolated or low feature-density region 203 typically etches with a desired shape and controlled lateral dimensions. In contrast, a high feature-density region 201 has sidewall regions 205 which are frequently bowed or undercut by the lateral etching due to insufficient sidewall passivation.

The bowing of the device feature can cause various deleterious effects including increased difficulty in performing subsequent process steps after the plasma etch. For example, if features in a shallow trench isolation (STI) are bowed due to a damage caused by the plasma etch process, a subsequent chemical vapor deposition (CVD) process used to fill the space between the STI features with an electrically insulating layer will leave a seam or void in the layer.

To avoid the lateral etching of sidewalls, an oxidation step (e.g., thermally formed or deposited silicon dioxide, $SiO_2$) is typically used to avoid insufficient sidewall passivation and a resulting lateral sidewall etch. However, the $SiO_2$ layer is formed by combining oxygen with silicon. In a thermal oxidation process, 44% of the $SiO_2$ layer is consumed silicon. Thus, the oxidizing step comes at the expense of the remaining silicon resulting in additional bowing and CD enlargement once the oxidized layer is removed.

As indicated by FIG. 2B, other process techniques result in a low feature-density region 253 etching at a faster rate with more passivation than a high feature-density region 251. The higher etch rate results in a tapered top portion 255 on etched sidewalls. Therefore, insufficient sidewall protection associated with the different etch rates in high and low feature-density regions with high aspect ratios often results in an inability to hold critical dimensions of the etch features and a resulting poor pattern transfer.

The tapered top portion 255 eventually leads to an etch depth micro-loading problem at a location where a multitude of features are closely populated thus affecting an overall CD of the features. Thus, it is becoming increasingly more difficult to etch closely populated features with small space CDs using contemporary continuous plasma etch processes.

Therefore, what is needed is an improved method to simultaneously etch high aspect ratio features of high and low feature-density regions while maintaining uniform CDs of the features.

SUMMARY

In an exemplary embodiment, a method of producing a plurality of etched features in an electronic device is disclosed. The method comprises performing a first time-divisional plasma etch process step within a plasma chamber to a first depth of the plurality of etched features, performing a flash process step to remove any polymers from exposed surfaces of the plurality of etched features without requiring an oxidation step, and performing a second time-divisional plasma etch process step within the plasma chamber to a second depth of the plurality of etched features.

In another exemplary embodiment, a method of producing a plurality of etched features in an electronic device is disclosed. The method comprises performing a first time-divisional plasma etch process step within a plasma chamber to a first depth of the plurality of etched features, evacuating the plasma chamber of any etchant chemicals, performing a flash process step to remove any polymers from exposed surfaces of the plurality of etched features without requiring an oxidation step, evacuating the plasma chamber of any cleaning chemicals, and performing a second time-divisional plasma etch process step within the plasma chamber to a second depth of the plurality of etched features.

In another exemplary embodiment, a method of producing a plurality of etched features in an electronic device is disclosed. The method comprises performing a first time-divisional plasma etch process step within a plasma chamber to a first depth of the plurality of etched features, and performing a flash process step to remove any polymers from exposed surfaces of the plurality of etched features without requiring an oxidation step. The flash process step is performed independently of the time-divisional plasma etch step. A second time-divisional plasma etch process step is performed within the plasma chamber to a second depth of the plurality of etched features.

BRIEF DESCRIPTION OF THE DRAWINGS

Various ones of the appended drawings merely illustrate exemplary embodiments of the present invention and must not be considered as limiting its scope.

DETAILED DESCRIPTION

The novel etch process described herein is effective in controlling both the vertical nature and the CDs of etched features as compared with prior art methods which involve a continuous plasma etch process and produce non-vertical and non-uniform sidewalls. As discussed above, typical high aspect ratio features, typically etched with a continuous plasma etch process, exhibit either pronounced bowing or tapering as the plasma etch proceeds. Additionally, the continuous plasma etch method exhibits substantial micro-loading.

In contrast, high aspect ratio features etched with various embodiments of the present invention, described below, have more vertical profiles combined with a minimal micro-loading depth and improved CDs.

Various embodiments of the present invention provide a novel plasma etch process comprising at least two cycles of time-divisional plasma etch (TDPE) steps, and one or more polymer-removal process (i.e., flash process) steps. The flash process step is performed at least once after an initial TDPE step is performed. Further, each of the various embodiments described herein alleviates the problem of micro-loading as structures are uniformly etched regardless of structural density on the substrate.

Figure 3:
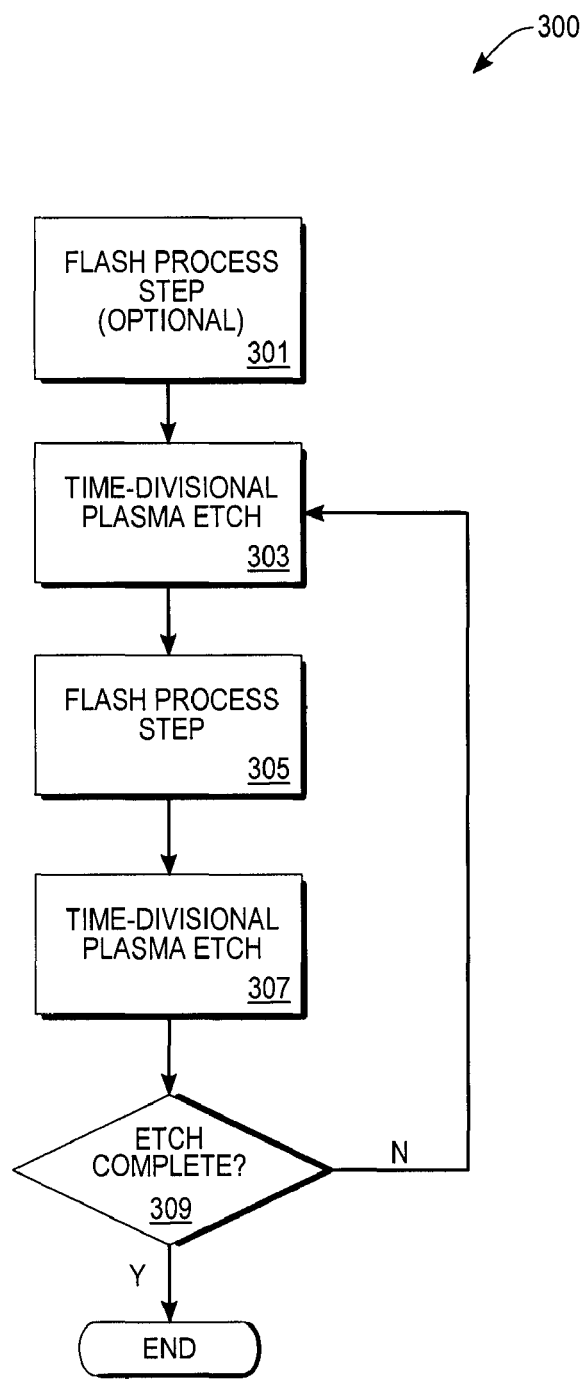
FIG. 3 is a simplified flowchart of an exemplary process flow of the present invention.

With reference to FIG. 3, an exemplary TDPE process 300 employed in, for example, a plasma etch chamber (not shown) includes an optional flash process step 301 prior to beginning a plurality of time-divisional plasma etch (TDPE) process steps. The optional flash process step 301 may be used as, for example, a break-through (BT) process step. If used, the BT process step, described in more detail below, is often used to remove various materials from the features to be etched. The various materials include dielectric layers formed such as silicon dioxide ($SiO_2$), silicon nitride ($Si_3N_4$), and so on. Dielectric layers may be removed with a halogen-containing gas such as hydrobromic acid (HBr).

Either as an initial step or after the optional flash process step 301, a first TDPE process step 303 is performed to etch the features to a first depth. The first TDPE process step 303 etches features on a substrate (not shown) to a first level. The plasma etch chamber is evacuated of any etchant gases. A flash process step 305 (i.e., a cleaning step) is next performed to remove any polymers or polymer residues that may remain on the features undergoing etch. The plasma chamber is then evacuated of any flash process feed gases. A second TDPE step 307 is performed to etch the features to a second depth. A determination 309 is then made whether the etch process is complete. If not, additional TDPE and flash process steps may be performed. If the etch is complete, the process ends. A skilled artisan will realize that after a determination 309 is made that an etch process is not complete, only one additional TDPE process step may be needed without any additional flash process steps.

In a specific exemplary embodiment involving formation of a shallow-trench isolation (STI) structure formation, the process recipe indicated in Table I, below, may be employed.

TABLE I

| Process Step | Chamber Pressure [mT] | Plasma Power [Watts] | Chuck Voltage [V] | Process Gas & Flow [SCCM] | Time [sec] | Temp [° C.] |
| --- | --- | --- | --- | --- | --- | --- |
| BT | 10 | 500 | 200 | $CF_4$ @ 100 | 5 | 30 |
| STI 1$^{st}$ Etch | 10 | 600 | 200 | $NF_3$ @ 10 HBr @ 500 | 25 | 30 |
| 1$^{st}$ Flash | 10 | 800 | 0 | $CF_4$ @ 100 | 10 | 50 |
| STI 2$^{nd}$ Etch | 10 | 600 | 200 | $NF_3$ @ 10 HBr @ 500 | 25 | 30 |
| 2$^{nd}$ Flash | 10 | 800 | 0 | $CF_4$ @ 100 | 10 | 50 |
| STI 3$^{rd}$ Etch | 10 | 600 | 200 | $NF_3$ @ 10 HBr @ 500 | 25 | 30 |
| 3$^{rd}$ Flash | 10 | 800 | 0 | $CF_4$ @ 100 | 10 | 50 |
| STI 4$^{th}$ Etch | 10 | 600 | 200 | $NF_3$ @ 10 HBr @ 500 | 25 | 30 |
| 4$^{th}$ Flash | 10 | 800 | 0 | $CF_4$ @ 100 | 10 | 50 |

As indicated by the specific exemplary process recipe of Table I, four TDPE STI etch steps are employed, each using two feed gases with each feed gas flowing at a different volumetric flow rate (standard cubic centimeters per minute, sccm). Additionally, a flash process step is performed initially as a BT step (for 5 seconds) and a separate flash process step (at 10 seconds each) is performed subsequent to each TDPE STI etch step. All process steps are performed at a chamber pressure of 10 milliTorr (mT).

Thus, in this specific exemplary embodiment, a TDPE process step is repeatedly performed for a pre-determined number of cycles while alternately performing a flash process step after each TDPE step. The alternate TDPE and flash process steps allow formation of a feature of pre-determined dimension and shape. Moreover, multiple flash processes may be modulated or adjusted for various desirable effects.

In other embodiments, the flash process step may be performed either with or without employing a plasma. Other energy types, such as, for example, thermal energy or photon energy may optionally be supplied to a flash process chamber during the flash process step. Additionally, the flash process can be performed either with or without a bias voltage applied to the substrate. The flash process step can be performed in either the process chamber employed for the TDPE process steps or may, alternatively, be performed in any other chamber.

Figure 1:
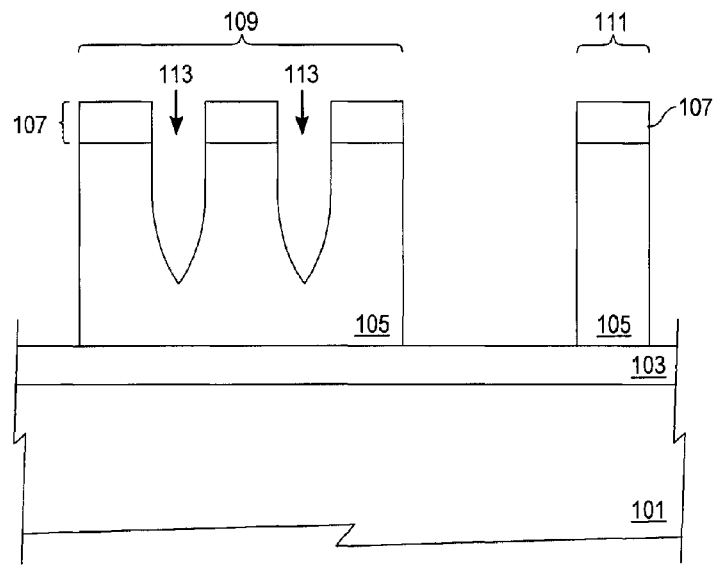
FIG. 1 is a cross-sectional view of etched features of high and low feature-density regions of the prior art.
Figure 2A:
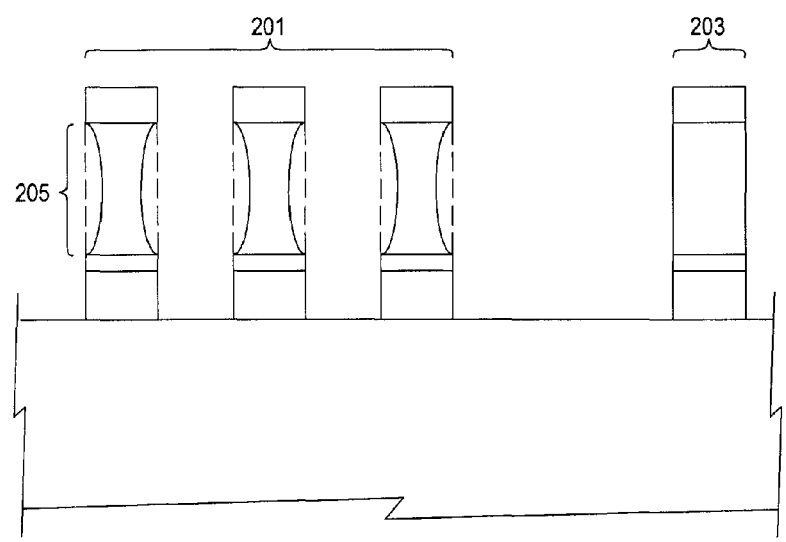
FIG. 2A is a cross-sectional view of etched features of high and low feature-density regions of the prior art where the high density-feature regions exhibit pronounced bowing.
Figure 2B:
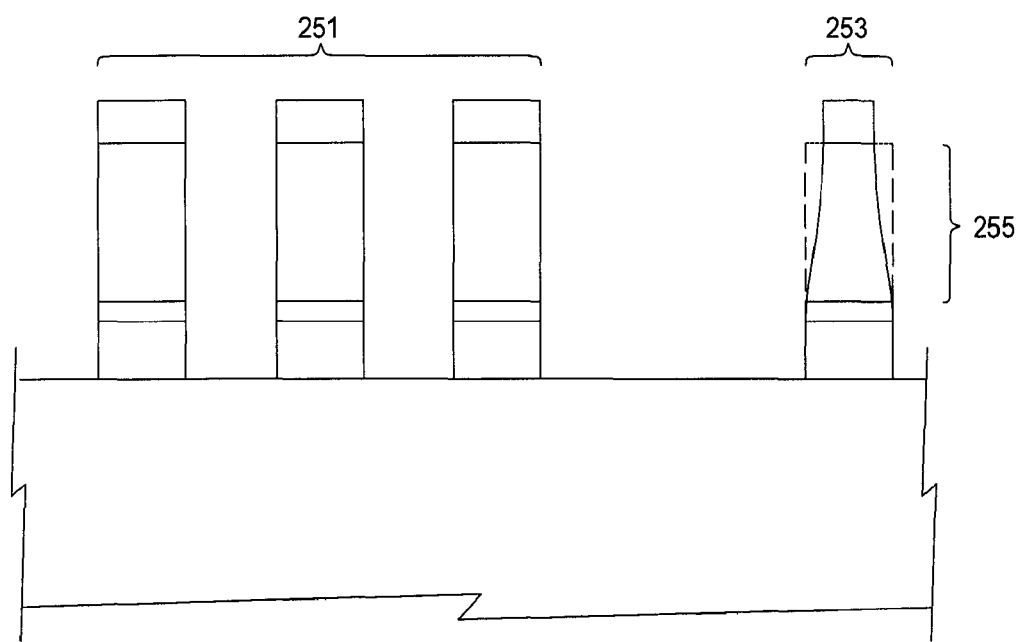
FIG. 2B is a cross-sectional view of etched features of high and low feature-density regions of the prior art where the low density-feature regions exhibit pronounced tapering.

Unlike prior art process steps in which intermittent cleaning steps are inserted into a continuous etch process, embodiments of the present invention avoid mixing etch and flash chemistries. Prior art chemical mixing can cause detrimental effects, such as a bowed profile (e.g., see FIG. 2) since some advantageous polymer layer formed in the etch process is immediately removed by coexisting cleaning chemistries. A proper amount of polymer layer avoids damage to features undergoing etch.

Further, prior art process steps frequently employ an oxidation step followed by an intermittent cleaning step with a fluorine-containing gas. As disclosed herein, the present invention does not require an oxidation step following the etch step. Thus, a throughput of, for example, an STI etch process maintains vertical feature profiles and reduces or eliminates micro-loading since the oxidizing process is not required.

Figure 4:
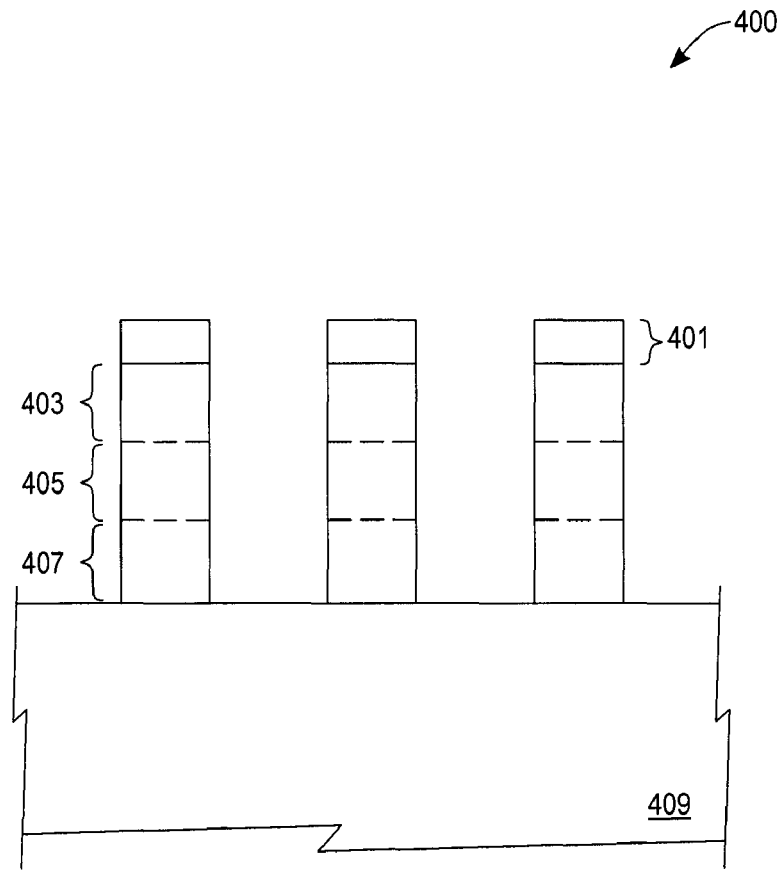
FIG. 4 is a cross-sectional view of high density features etched using the exemplary process flow of FIG. 3.

Referring now to FIG. 4, an exemplary high density structure 400 incorporates a plurality of features formed on a substrate 409. Each of the plurality of features is capped with an etching mask 401, such as photoresist or a hard mask. Various types of etching masks, usable in different etching environments, are known independently in the art.

With concurrent reference to the exemplary TDPE process 300 of FIG. 3, described above, effects of TDPE process steps are reflected in the exemplary high density structure 400. After a first TDPE process step, a first depth 403 is reached. A process chamber (not shown) in which the substrate 409 is placed is evacuated and a subsequent first flash process step is performed. A second TDPE process step increases the amount of etch to a second depth 405. The process chamber is again evacuated and a second flash process step is performed. A third TDPE process step increases the amount of etch to a third depth 407.

Contrary to many prior art continuous plasma etch processes in which formation of a polymer and its removal occur simultaneously on a surface of an etched feature, the present invention provides one or more flash steps before and/or after the time-divisional plasma etch (TDPE) step until a feature of a desired dimension is formed. Thus, any polymer layer formed, which can result in tapering as described above, can effectively be removed and the subsequent tapering prevented. Consequently, the combined TDPE/flash process results in a feature having increased verticality that is less prone to micro-loading profile effects than possible under continuous plasma processes of the prior art.

Further, by performing a pre-determined number of TDPE and flash process steps, the etch depth can accurately and precisely be controlled. By modulating the process time of the TDPE and flash process steps, the shape, the CD of the feature, and the CD spacing can readily be controlled.

Additionally, by modifying portions of the two main elements of the present invention, other detrimental effect of a plasma etch process, such as bowing of the feature, can be controlled.

The present invention is described above with reference to specific embodiments thereof. It will, however, be evident to a skilled artisan that various modifications and changes can be made thereto without departing from the broader spirit and scope of the present invention as set forth in the appended claims.

For instance, particular embodiments describe a number of chemical types used in various amounts and configurations. A skilled artisan will recognize that these chemical types may be varied and those shown herein are for exemplary purposes only in order to illustrate the novel nature of the time-divisional plasma etch concepts. A skilled artisan will recognize that, for example, fluorine- and chlorine-based etchant feed gases may readily be employed along with or instead of halogen-based feed gases.

Moreover, the term semiconductor should be construed throughout the description to include data storage, flat panel display, as well as allied or other industries. These and various other embodiments are all within a scope of the present invention. The specification and drawings are, accordingly, to be regarded in an illustrative rather than a restrictive sense.

What is claimed is:

1. A method of producing a plurality of etched features in an electronic device, the method comprising:

performing a first time-divisional plasma etch process step within a plasma chamber to etch a plurality of features to a first depth;

stopping the first time-divisional plasma etch process step;

evacuating etchant gases from the plasma chamber;

after the evacuating of the etchant gases from the plasma chamber, performing a flash process step to remove polymers from exposed surfaces of the plurality of features without requiring an oxidation step to form an oxide on the plurality of features, the flash process step being performed without a bias voltage applied to a substrate containing the plurality of features;

stopping the flash process step;

evacuating flash processing gases from the plasma chamber;

performing a second time-divisional plasma etch process step within the plasma chamber to etch the plurality of features to a second depth, the second depth being at a great depth than the first depth; and making a determination whether a final etch depth has been reached, the final etch depth being determined by whether a desired dimension is achieved for the plurality of etched features, wherein the flash process step is performed without the use of oxygen.

2. The method of claim 1, further comprising performing an initial flash process step prior to performing the first time-divisional plasma etch process step.

3. The method of claim 1, wherein the flash process step is performed without generating a plasma.

4. The method of claim 1, wherein the flash process step is performed with a generated plasma.

5. The method of claim 1, further comprising performing one or more additional time-divisional plasma etch process steps until a final etch depth is reached.

6. The method of claim 5, further comprising performing an additional flash process step after each of the one or more additional time-divisional plasma etch process steps.

7. A method of producing a plurality of etched features in an electronic device, the method comprising:

performing a first time-divisional plasma etch process step within a plasma chamber to etch a plurality of features to a first depth;

stopping the first time-divisional plasma etch process step;

evacuating the plasma chamber of etchant chemicals;

after evacuating the plasma chamber of the etchant chemicals, performing a flash process step to remove polymers from exposed surfaces of the plurality of etched features without requiring an oxidation step to form an oxide on the plurality of features, the flash process step being performed without a bias voltage applied to a substrate containing the plurality of features;

stopping the flash process step;

evacuating the plasma chamber of cleaning chemicals;

after evacuating the plasma chamber of the cleaning chemicals, performing a second time-divisional plasma etch process step within the plasma chamber to etch the plurality of features to a second depth, the second depth being at a greater depth than the first depth; and making a determination whether a final etch depth has been reached, the final etch depth being determined by whether a desired dimension is achieved for the plurality of etched features, wherein the flash process step is performed without the use of oxygen.

8. The method of claim 7, further comprising performing an initial flash process step prior to performing the first time-divisional plasma etch process step.

9. The method of claim 7, wherein the flash process step is performed without generating a plasma.

10. The method of claim 7, wherein the flash process step is performed with a generated plasma.

11. The method of claim 7, further comprising performing one or more additional time-divisional plasma etch process steps until a final etch depth is reached.

12. The method of claim 11, further comprising performing an additional flash process step after each of the one or more additional time-divisional plasma etch process steps.

13. A method of producing a plurality of etched features in an electronic device, the method comprising:

performing a first time-divisional plasma etch process step within a plasma chamber to etch a plurality of features to a first depth;

stopping the first time-divisional plasma etch process step;

evacuating etchant gases from the plasma chamber;

after the evacuating of the etchant gases from the plasma chamber, performing a flash process step to remove polymers from exposed surfaces of the plurality of etched features without requiring an oxidation step to form an oxide on the plurality of features, the flash process step being performed independently of the first time-divisional plasma etch step, the flash process step further being performed without a bias voltage applied to a substrate containing the plurality of features;

stopping the flash process step;

evacuating flash processing gases from the plasma chamber;

performing a second time-divisional plasma etch process step within the plasma chamber to etch the plurality of features to a second depth, the second depth being at a greater depth than the first depth; and making a determination whether a final etch depth has been reached, the final etch depth being determined by whether a desired dimension is achieved for the plurality of etched features, wherein the flash process step is performed without the use of oxygen.

14. The method of claim 13, further comprising performing an initial flash process step prior to performing the first time-divisional plasma etch process step.

15. The method of claim 13, wherein the flash process step is performed without generating a plasma.

16. The method of claim 13, wherein the flash process step is performed with a generated plasma.

17. The method of claim 13, further comprising performing one or more additional time-divisional plasma etch process steps until a final etch depth is reached.

18. The method of claim 17, further comprising performing an additional flash process step after each of the one or more additional time-divisional plasma etch process steps.

* * * * *